United States Patent
Jung et al.

(10) Patent No.: US 9,448,777 B2
(45) Date of Patent: Sep. 20, 2016

(54) APPARATUS AND METHOD FOR GENERATING ASSERTION BASED ON USER PROGRAM CODE, AND APPARATUS AND METHOD FOR VERIFYING PROCESSOR USING ASSERTION

(71) Applicant: Samsung Electronics Co., Ltd., Suwon-si (KR)

(72) Inventors: Jin-sae Jung, Yongin-si (KR); Hee-jun Shim, Seoul (KR); Young-chul Cho, Yongin-si (KR); Yen-jo Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 312 days.

(21) Appl. No.: 14/021,134

(22) Filed: Sep. 9, 2013

(65) Prior Publication Data

US 2014/0075421 A1 Mar. 13, 2014

Related U.S. Application Data

(60) Provisional application No. 61/698,050, filed on Sep. 7, 2012.

(30) Foreign Application Priority Data

Aug. 13, 2013 (KR) .................. 10-2013-0096109

(51) Int. Cl.
*G06F 9/45* (2006.01)
*G06F 17/50* (2006.01)

(52) U.S. Cl.
CPC ............. *G06F 8/43* (2013.01); *G06F 17/5022* (2013.01); *G06F 17/5031* (2013.01)

(58) Field of Classification Search
None
See application file for complete search history.

(56) References Cited

U.S. PATENT DOCUMENTS

| 7,051,299 | B2* | 5/2006 | Chadha | G06F 17/5022 714/E11.167 |
| 7,603,636 | B2 | 10/2009 | Yamada | |
| 7,865,853 | B2 | 1/2011 | Hekmatpour et al. | |
| 7,992,114 | B1* | 8/2011 | Adams | G06F 17/5031 716/106 |
| 2005/0209840 | A1* | 9/2005 | Baklashov | G06F 17/504 703/22 |

(Continued)

FOREIGN PATENT DOCUMENTS

| JP | 4255079 B2 | 2/2009 |
| KR | 1020080055913 A | 6/2008 |

OTHER PUBLICATIONS

Beatty et al., "Formally verifying a microprocessor using a simulation methodology," 1994, DAC '94 Proceedings of the 31st annual Design Automation Conference, pp. 596-602.*

(Continued)

*Primary Examiner* — Thuy Dao
*Assistant Examiner* — Stephen Berman
(74) *Attorney, Agent, or Firm* — Sughrue Mion, PLLC (57) ABSTRACT

Exemplary embodiments disclose a method for generating an assertion based on a user program code. The method may include receiving a user program comprising at least one assertion directive, a compiled result of the user program, and architecture information of a processor, and generating, based on the compiled result of the user program and the architecture information of the processor, an assertion which states an operation that the processor needs to perform in accordance with a code of the user program indicated by each of the at least one assertion directive.

19 Claims, 8 Drawing Sheets

(56) References Cited

U.S. PATENT DOCUMENTS

| | | | |
|---|---|---|---|
| 2006/0064296 A1* | 3/2006 | Devins | G06F 17/5022 703/22 |
| 2007/0083548 A1* | 4/2007 | Li | G06F 8/427 |
| 2007/0277163 A1* | 11/2007 | Avresky | G06F 8/43 717/140 |
| 2008/0104556 A1* | 5/2008 | Yamada | G06F 17/5022 716/102 |
| 2008/0222205 A1 | 9/2008 | Lange | |
| 2008/0306721 A1* | 12/2008 | Yang | G06F 11/261 703/14 |
| 2009/0019406 A1* | 1/2009 | Endoh | G06F 17/5022 716/106 |
| 2011/0055780 A1* | 3/2011 | Venell | G01R 31/318364 716/106 |
| 2011/0218795 A1* | 9/2011 | Cho | G06F 9/44 703/21 |
| 2012/0005681 A1 | 1/2012 | Reddy | |
| 2012/0323549 A1* | 12/2012 | Bashteen | G06F 17/5045 703/14 |
| 2013/0111423 A1* | 5/2013 | Xia | G06F 8/43 716/103 |
| 2015/0161315 A1* | 6/2015 | Meil | G06F 17/5031 716/108 |

OTHER PUBLICATIONS

Chattopadhyay et al., "Integrated verification approach during ADL-driven processor design," 2009, Microelectronics Journal, vol. 40, Issue 7, pp. 1111-1123.*

Adir et al., "Genesys-Pro: innovations in test program generation for functional processor verification," 2004, IEEE Design & Test of Computers, vol. 21, Issue 2, pp. 84-93.*

* cited by examiner

```
31.   #pragma rpcc cga
32.   for (i=0 ; i<N ; i++) {
33.      mul_out = i*10
34.      result += mul_out;
31.      //#Assert when i==3, A3_CHECK    ~300
35.      A[i] = result;
36.   }
```

FIG. 4

| Cycle | FU00 | FU01 | FU02 | FU03 | FU04 | FU05 | FU06 | FU07 | FU08 | FU09 | ... |
|---|---|---|---|---|---|---|---|---|---|---|---|
| 1 | add | add | | | | add | | | | | |
| 2 | st_i | | | | mov | | | | | lsl | |
| 3 | | | pred (i=0) | mul (i=0) | | | | | | | |
| 4 | | add (i=0) | | | | add (i=0) | | | | | |
| 5 | add | | | | mov | | | | | lsl (i=0) | |
| 6 | st_i | | | | | | | | | | |
| 7 | | | pred (i=1) | mul (i=1) | | | | | | | |
| 8 | | add (i=1) | | | | add (i=1) | | | | | |
| 9 | add (i=0) | | | | mov (i=0) | | | | | lsl (i=1) | |
| 10 | st_i (i=0) | | | | | | | | | | |
| 11 | | | pred (i=2) | mul (i=2) | | | | | | | |
| 12 | | add (i=2) | | | | add (i=2) | | | | | |
| 13 | add (i=1) | | | | mov (i=1) | | | | | lsl (i=2) | |
| 14 | st_i (i=1) | | | | | | | | | | |
| 15 | | | pred (i=3) | mul (i=3) | | | | | | | |
| 16 | | add (i=3) | | | | add (i=3) | | | | | |
| 17 | add (i=2) | | | | mov (i=2) | | | | | lsl (i=3) | |
| 18 | st_i (i=2) | | | | | | | | | | |
| 19 | | | pred (i=4) | mul (i=4) | | | | | | | |
| 20 | | add (i=4) | | | | add (i=4) | | | | | |
| 21 | add (i=3) | | | | mov (i=3) | | | | | lsl (i=4) | |
| 22 | st_i (i=3) | | | | | | | | | | |
| ... | | | | | | | | | | | |

FIG. 5

```
11.    //#Assert when i==3, A3_check
12.    property A3_check ;
13.       posedge clk disable iff (rst ==0)
14.         (cga_mode && FU05 . din_0 == 0) 1=> ##22
(FU00 . opcode == 'st_i & FU00.data_out == ) ;
15.
16.    endproperty
17.
18.    assert_checker: assert_property (A3_checker)
```

APPARATUS AND METHOD FOR GENERATING ASSERTION BASED ON USER PROGRAM CODE, AND APPARATUS AND METHOD FOR VERIFYING PROCESSOR USING ASSERTION

CROSS-REFERENCE TO RELATED APPLICATION(S)

This application claims priority from a U.S. Provisional Patent Application No. 61/698,050, filed on Sep. 7, 2012, and a Korean Patent Application No. 10-2013-0096109, filed on Aug. 13, 2013, the entire disclosures of which are incorporated herein by reference.

BACKGROUND

1. Field

Exemplary embodiments relate to a technology for generating an assertion and verifying a processor using the assertion.

2. Description of the Related Art

Functional verification of a processor in the related art means a verification to check whether an architecture specification of a processor and a processor designed at a Resister Transfer Level (RTL) logically perform the same operation. Verification test cases in the related art, such as a regression test and a random text, are applied in verifying a designed processor. In addition, test coverage is measured to check whether various design functions have been verified.

Text coverage in the related art is largely divided into code coverage and functional coverage. Code coverage is an indicator of how thoroughly a designed code is tested during simulation of a text case, and functional coverage is an indicator of whether a function that an engineer wants to measure is executed.

Functional coverage is a method for measuring whether an assertion is executed by designing the assertion for an operation that has to be performed or that should not be performed among the processor operations that the engineer wants to measure.

In assertion based verification (ABV), an assertion is inserted into a designed processor and the processor, into which the assertion is inserted, is simulated. During simulation of the processor, it is easy to find an error detected point by monitoring and checking the inserted assertion, so that verification time may be reduced.

However, an assertion in the related art has to be designed by a user based on the architecture specification of a processor and needs to be redesigned whenever the architecture specification is changed. In addition, in the related art, it is necessary to verify whether the assertion is properly designed. Thus, a lot of time and effort is required to design an assertion.

SUMMARY

In an aspect of an exemplary embodiment, a method for generating an assertion based on a user program code is provided, and the method includes receiving a user program including at least one assertion directive, a compiled result of the user program, and architecture information of a processor; and generating, based on the compiled result of the user program and the architecture information of the processor, an assertion which states an operation that the processor needs to perform in accordance with a code of the user program indicated by each of the at least one assertion directive.

The at least one assertion directive may indicate the code requiring verification of the operation of the processor from among a plurality of codes contained in the user program.

The generating the assertion may include determining the code requiring verification of the operation of the processor from among a plurality of codes contained in the user program based on an interpretation of the at least one assertion directive; and determining a point in time based on schedule information in the compiled result and the architecture information of the processor, at which the determined code of the user program, indicated by each of the at least one assertion directive, is executed, and a functional block which executes the code at the point in time.

The generating the assertion may include generating the assertion which states the operation that the functional block needs to perform at the point in time.

The generating the assertion may include generating the assertion using Hardware Description Language (HDL).

The generating the assertion may include generating the assertion corresponding to each of the at least one assertion directive.

In another aspect of an exemplary embodiment, an assertion generating apparatus is provided, and the assertion generating apparatus includes a receiver configured to receive a user program including at least one assertion directive, a compiled result of the user program, and architecture information of a processor; and an assertion generator configured to generate, based on the compiled result of the user program and the architecture information of the processor, an assertion which states an operation that the processor needs to perform in accordance with a code of the user program, indicated by each of the at least one assertion directive.

The at least one assertion directive may indicate the code requiring verification of the operation of the processor from among a plurality of codes contained in the user program.

The assertion generator may determine a code requiring verification of the operation of the processor from among a plurality of codes contained in the user program; and determines a point in time based on schedule information contained in the compiled result and the architecture information of the processor, at which the determined code of the user program, indicated by each of the at least one assertion directive, is executed, and a functional block which executes the code at the point in time.

The assertion generator may generate the assertion which states the operation that the functional block needs to perform at the point in time.

The assertion generator may generate the assertion using Hardware Description Language (HDL).

The assertion generator may generate the assertion corresponding to each of the at least one assertion directive.

In still another aspect of exemplary embodiments, a method for verifying a processor is provided, and the method includes receiving a user program including at least one assertion directive, a compiled result of the user program, and architecture information of a processor; generating, based on the compiled result and the architecture information of the processor, an assertion which states an operation that the processor needs to perform in accordance with a code of the user program indicated by each of the at least one assertion directive; and simulating the compiled result in a processor model at a Register Transmission Level (RTL) so as to verify whether the operation stated in the assertion is performed in the processor model.

Each of the at least one assertion directive may indicate the code requiring verification of the operation of the processor from among a plurality of codes contained in the user program.

The generating the assertion may include determining the code requiring verification of the operation of the processor from among a plurality of codes contained in the user program based on an interpretation of the at least one assertion directive, and determining a point in time based on the schedule information contained in the compiled result and the architecture information of the processor, at which the determined code of the user program, indicated by each of the at least one assertion directive, is executed, and a functional block which executes the code at the point in time.

The generating the assertion may include generating the assertion which states the operation that the functional block needs to perform at the point in time.

The generating the assertion may include generating the assertion using Hardware Description Language (HDL).

The generating the assertion may include generating an assertion corresponding to each of the at least one assertion directive.

The simulating the compiled result may include inserting the assertion into the processor model and simulating the compiled result in the processor model in which the assertion is inserted.

In yet another aspect of an exemplary embodiment, a processor verifying apparatus is provided, and the processor verifying apparatus includes a receiver configured to receive a user program including at least one assertion directives, a compiled result of the user program and architecture information of a processor; an assertion generator configured to generate, based on the compiled result of the user program and the architecture information of the processor, an assertion which states an operation that a processor needs to perform in accordance with a code of the user program indicated by each of the at least one assertion directive; and a verifier configured to simulate the compiled result in a processor model at a Register Transmission Level (RTL) so as to verify whether the operation stated in the assertion is performed in the processor model.

Each of the at least one assertion directive may indicate the code requiring verification of the operation of the processor from among a plurality of codes contained in the user program.

The assertion generator may interpret the at least one assertion directive so as to determine the code requiring verification of the operation of the processor from among a plurality of codes contained in the user program, and determines a point in time based on schedule information contained in the compiled result and the architecture information of the processor, at which the determined code of the user program, indicated by each of the at least one assertion directive, is executed, and a functional block which executes the code at the point in time.

The assertion generator may generate the assertion which states the operation that the functional block needs to perform at the point in time.

The assertion generator may generate the assertion using Hardware Description Language (HDL).

The assertion generator may generate the assertion corresponding to each of the at least one assertion directive.

The verifier may insert the assertion into the processor model and then simulates the compiled result in the processor model into which the assertion is inserted.

In yet another further aspect of an exemplary embodiment, a method for generating an assertion based on a user program code may include receiving a user program, a compiled result of the user program, and an architecture information of a processor; interpreting an assertion directive so as to determine a code from a plurality of codes in the user program; determining a point in time in which the code of the user program is executed; determining a functional block which executes the code of the user program at the point in time; and generating an assertion at the point in time in which the code of the user program is executed.

Other features and aspects may be apparent from the following detailed description, the drawings, and the claims.

BRIEF DESCRIPTION OF THE DRAWINGS

The above and other features and advantages of the exemplary embodiments will become more apparent by describing in detail exemplary embodiments thereof with reference to the attached drawings in which.

DETAILED DESCRIPTION OF EXEMPLARY EMBODIMENTS

Throughout the drawings and the detailed description, unless otherwise described, the same drawing reference numerals will be understood to refer to the same elements, features, and structures. The relative size and depiction of these elements may be exaggerated for clarity, illustration, and convenience.

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
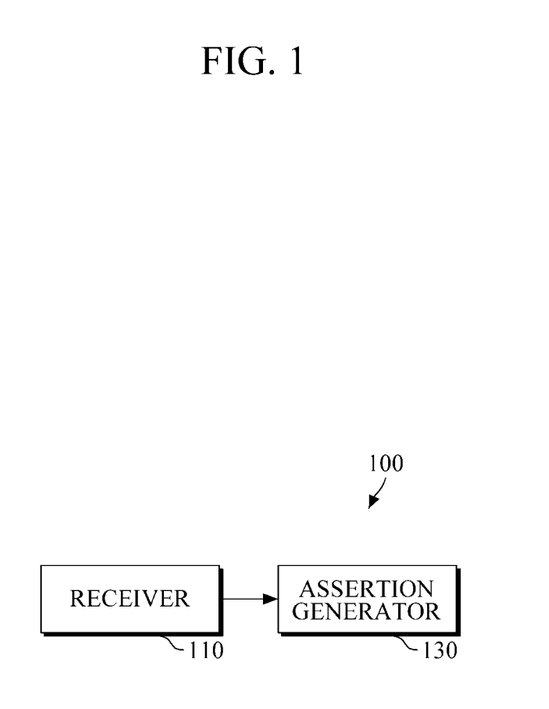
FIG. 1 is a diagram illustrating a configuration of an assertion generating apparatus according to an exemplary embodiment.

FIG. 1 is a diagram illustrating a configuration of an assertion generating apparatus according to an exemplary embodiment.

Referring to FIG. 1, an assertion generating apparatus 100 generates an assertion using Hardware Description Language (HDL) so as to verify an operation of a processor model designed at a Register Transfer Level (RTL).

An assertion is a statement about an operation that a processor has to perform during run time. For example, an assertion may state a condition of an operation that the processor has to perform, and may state that an error is to be output if the processor fails to meet the condition during run time of a user program.

The assertion generating apparatus 100 may include a receiver 110 and an assertion generator 130.

The receiver 110 receives a user program, a compiled result of the user program, and architecture information of a processor.

A user program is arbitrarily made by a programmer to verify an operation of a processor, and may include one or more assertion directives.

An assertion directive indicates a code requiring verification of an operation of a processor from among the entire codes of the user program. Further, a user may generate an assertion, such as to insert an assertion directive into a code requiring verification of an operation of a processor, from among the entire codes of the user program.

Figure 3:
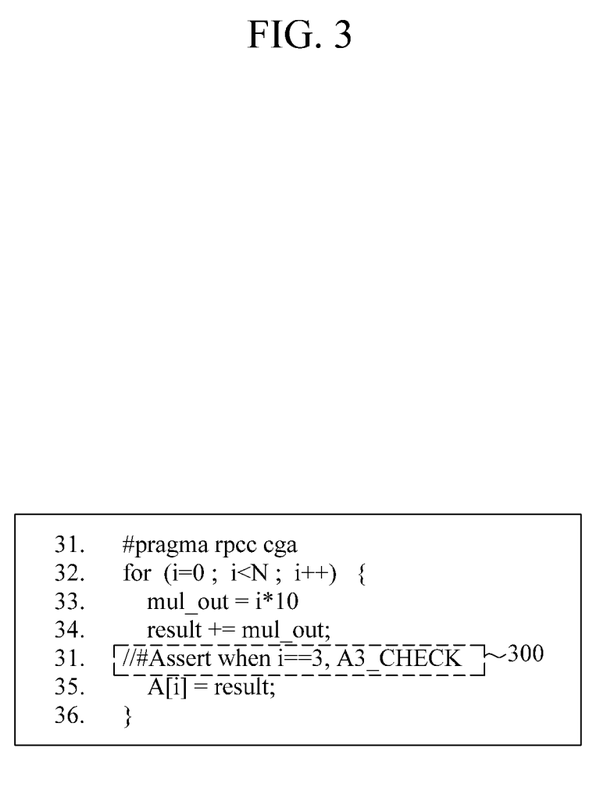
FIG. 3 is an example of a text program.

With reference to an example of a user program illustrated in FIG. 3, an assertion directive 300 states that, if the loop counter (i) is 3, an assertion is generated to verify a processor that performs the operation 'A[i]=result'. One or more assertion directives may be inserted in a text program.

Architecture information of a processor may include the number and types of functional blocks contained in a processor, interconnections between the functional blocks, a control flow of the functional blocks, and information about a configuration of the processor.

A compiled result of a user program refers to a binary code converted by a compiler from a user program so as to be instantly executable in a processor.

The assertion generator 130 generates an assertion based on source code of an input user program, a compiled result of the user program, and architecture information of a processor.

The assertion generator 130 may interpret an assertion directive included in a user program so as to find a code requiring verification of an operation of a processor from among the entire codes of the user program. For example, the assertion directive 300 illustrated in FIG. 3 states that, if the loop counter (i) is 3, an assertion is generated to verify a value stored in a functional block of a processor that stores the variable A[i]. Thus, given the assertion directive 300, the assertion generator 130 verifies an operation of a processor that performs 'A[i]=result' when the loop counter (i) is 3.

Interpreting the assertion directive 300 is not enough to find which functional block of a processor at which point in time includes a code, indicated by the assertion directive 300, is executed For this reason, in order to find how an operation indicated by an assertion directive is executed in a processor, a compiled result of a user program and architecture information of a processor are required.

For example, suppose that an assertion directive indicates verifying a predetermined multiplexing calculation performed by a processor, the calculation which is an operation stated in a code of a user program. In this case, based on schedule information included in a compiled result of a user program and architecture information of the processor, a functional block of the processor must be found which performs the predetermined multiplexing calculation and an execution cycle at which the functional block performs the predetermined multiplexing calculation.

Accordingly, based on the compiled result and the architecture information of the processor, the assertion generator 130 determines a point in time, at which a code of a user program, indicated by the assertion directive, is executed, and a functional block of the processor that executes the code at the point in time. Further, the compiled result of the user program includes schedule information in which the user program is scheduled to fit an architecture of the processor, so that the user program is instantly executed in the processor. Thus, based on the scheduling information and the processor architecture, it is possible to find the functional block of the processor and the cycle at which a predetermined code of the user program, indicated by an assertion directive, is executed.

Figure 4:
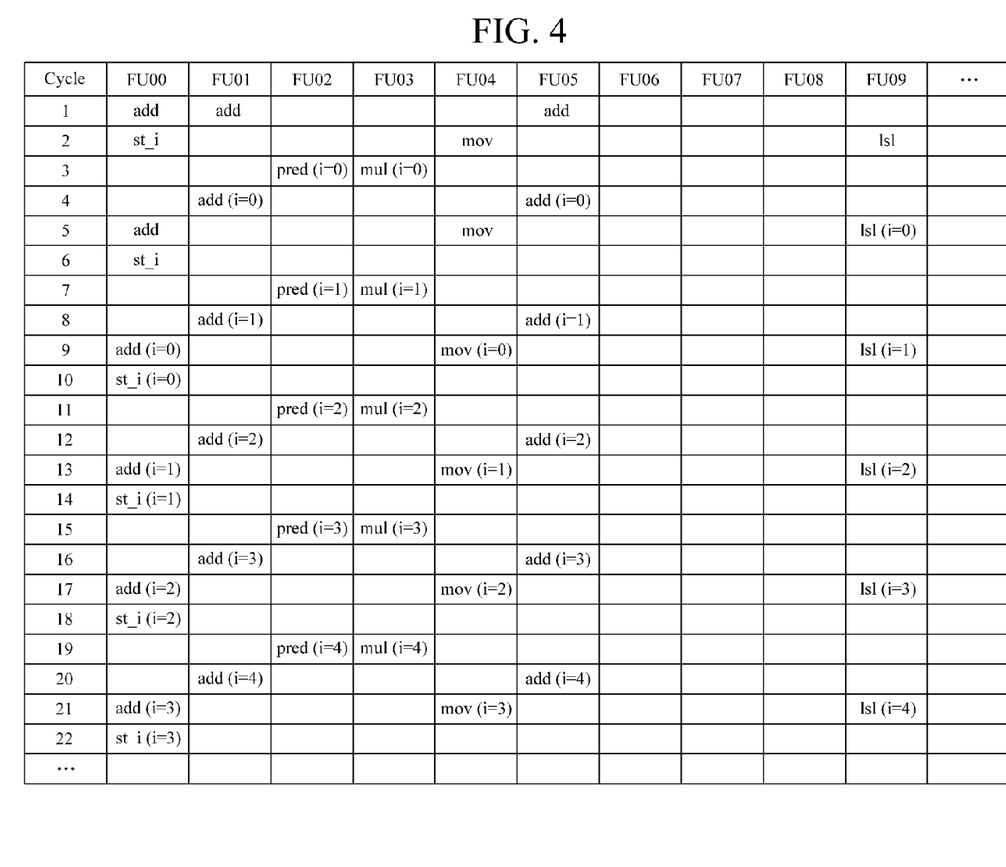
FIG. 4 is an example of a compiled result of a user program shown in FIG. 3.
Figure 5:
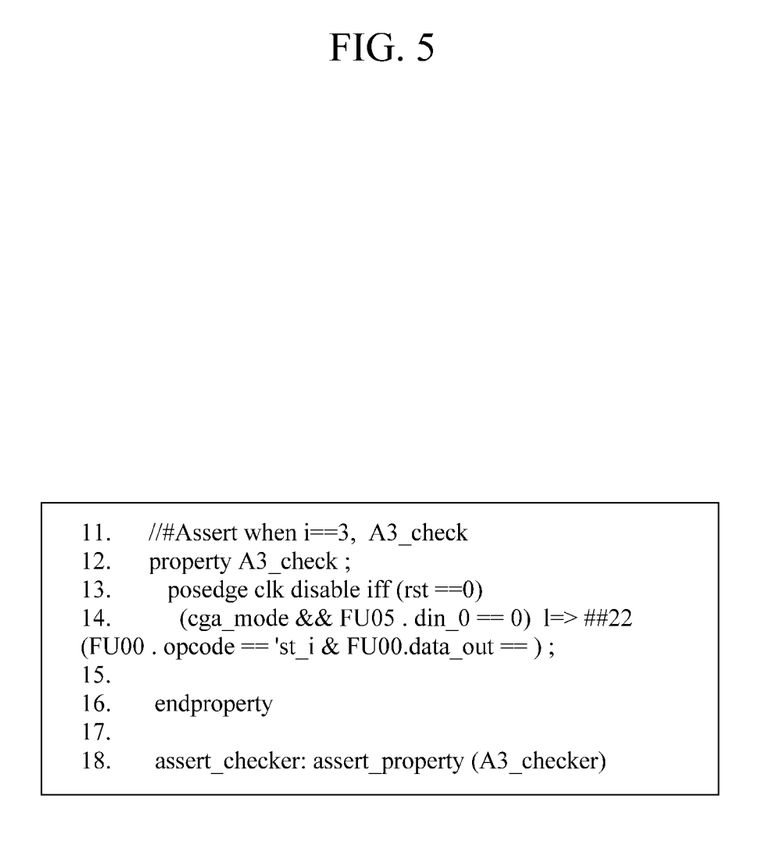
FIG. 5 is an example of a generated assertion.

For example, as shown in FIG. 4, the user program shown in FIG. 3 may be scheduled. In FIG. 4, each of FU#00 through FU#09 refers to a function unit included in a processor, and an operation is allocated to each function unit to be executed at each cycle. If the loop counter in the schedule information is 3, the operation 'A[i]=result' is allocated to FU#00 at cycle 22. Accordingly, as shown in FIG. 5, when FU#05 mapped with the variable i, indicating a loop counter, is 0, the assertion generator 130 may consider a loop starting. Thus, an assertion may be generated to verify a value stored in FU#00 after cycle 22.

If a user program includes one or more assertion directives, the assertion generator 130 may generate an assertion corresponding to each assertion directive.

In addition, the assertion generator 130 may generate an assertion using Hardware Description Language (HDL), e.g., System Verilog, Verilog HDL, VHDL, System Verilog, and HDVL.

Figure 2:
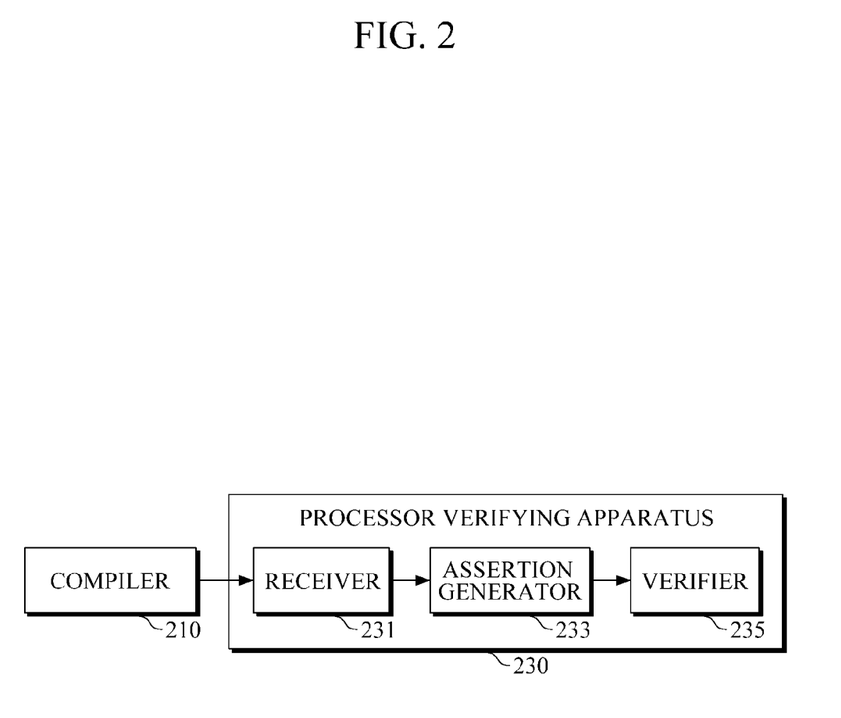
FIG. 2 is a diagram illustrating a configuration of a processor verifying apparatus according to an exemplary embodiment.

FIG. 2 is a diagram illustrating a configuration of a processor verifying apparatus according to an exemplary embodiment.

Referring to FIG. 2, a processor verifying apparatus 230 is designed to verify an operation of a processor model designed at RTR using Hardware Description Language (HDL), such as, System Verilog, Verilog HDL, Vhsic Hardware Description Language (VHDL) and Hardware Description and Verification Language (HDVL).

A compiler 210 converts codes of a user program to fit architecture of a designed processor in order to verify the processor, schedules the converted codes in a functional block of the processor, and generates binary codes which are executable in the processor. The user program may include one or more assertive directives.

The processor verifying apparatus 230 may include a receiver 231, an assertion generator 233, and a verifier 235.

The receiver 231 receives a user program, a compiled result of the user program, and architecture information of a processor. The compiled result of the user program may be provided by the compiler 210. In addition, the user program and the architecture information of the processor may be received from a user.

The assertion generator 233, corresponding to the assertion generating apparatus 100 shown in FIG. 1, may generate an assertion based on the user program, the compiled result of the user program, and the architecture information of the processor, which are received through the receiver 231.

An assertion may be generated using HDL, such as, System Verilog, Verilog HDL, VHDL, System Verilog, and HDVL.

Further, the assertion generator 233 may interpret an assertion directive, included in the user program, so as to find a code requiring verification of an operation of a processor, from among the entire codes of the user program. In addition, based on schedule information contained in the compiled result and the architecture information of the processor, the assertion generator 233 determines a point in time, at which an operation of the processor is executed in accordance with the code indicated by the assertion directive, and a functional block that performs the operation at the point in time. The assertion generator 233 generates an assertion which states the operation that the functional block executes at the point in time.

The verifier 235 simulates the compiled result of the user program in a processor model designed at RLT so as to verify whether the operation stated in the assertion is performed.

Further, the verifier 235 inserts an assertion, generated by the assertion generator 233, into a processor model based on processor design hierarchy information. Then, the verifier 235 simulates a compiled result of a user program in the processor model in which the assertion is inserted. By checking whether an operation stated in the assertion is performed during simulation, the verifier 235 verifies the operation of the processor.

Figure 6:
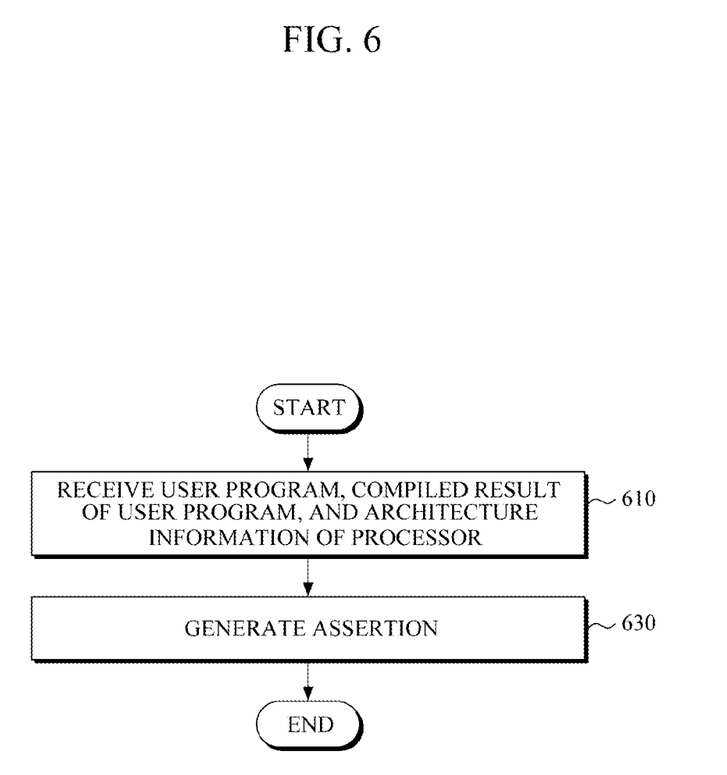
FIG. 6 is a flow chart illustrating a method for generating an assertion according to an exemplary embodiment.

FIG. 6 is a flow chart illustrating a method for generating an assertion according to an exemplary embodiment.

Referring to FIG. 6, in Step 610, the assertion generating apparatus 100 receives a user program, a compiled result of the user program, and architecture information of a processor.

The user program may include one or more assertion directives.

In Step 620 of FIG. 6, based on the compiled result of the user program and the architecture information of a processor, the assertion generating apparatus 100 generates an assertion stating an operation that the processor needs to perform in accordance with a code of the user program, which is indicated by the assertion directive. The assertion may be generated using HDL, such as, System Verilog, Verilog HDL, VHDL, System Verilog, and HDVL.

In addition, if the user program includes one or more assertion directives, the assertion generating apparatus 100 may generate an assertion corresponding to each assertion directive.

Figure 7:
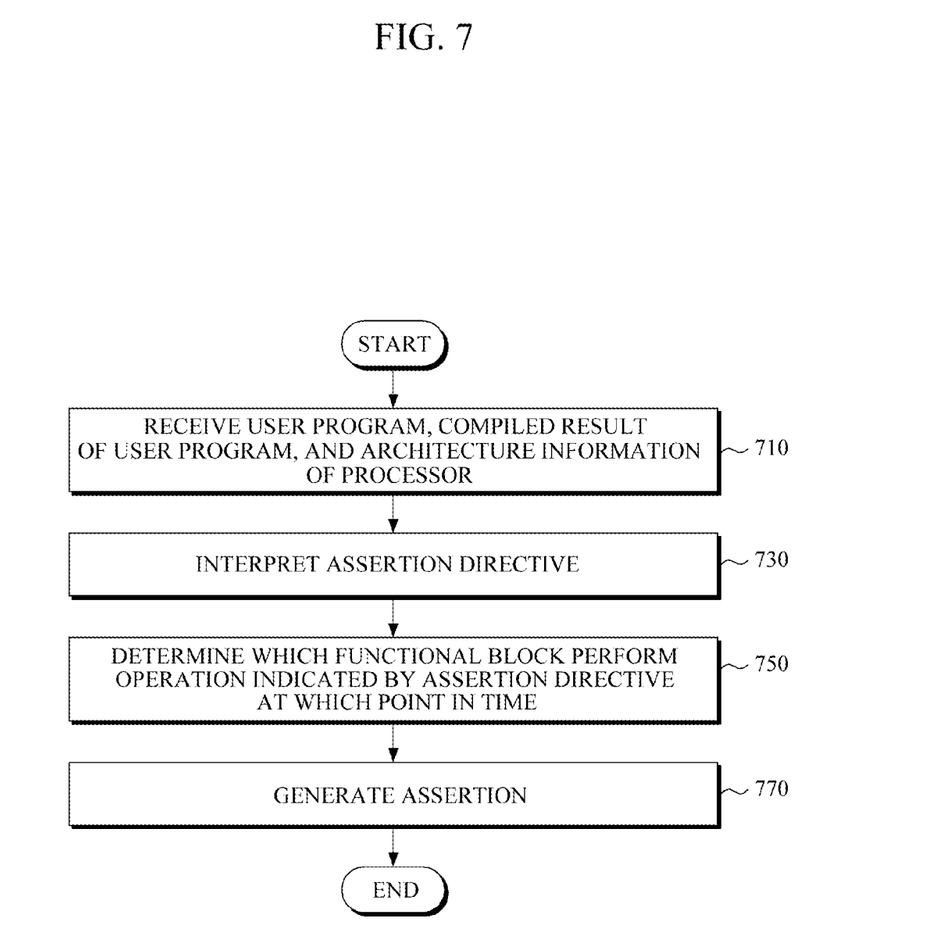
FIG. 7 is a detailed flow chart illustrating a method for generating an assertion according to an exemplary embodiment.

FIG. 7 is a detailed flow chart illustrating a method for generating an assertion according to an exemplary embodiment.

Referring to FIG. 7, in Step 710, the asserting generating apparatus 100 may receive a user program including one or more assertion directives, a compiled result of the user program, and architecture information of a processor.

Referring to FIG. 7, in Step 730, the assertion generating apparatus 100 may interpret an assertion directive so as to determine a code requiring verification of an operation of a processor, from among the entire codes included in a user program.

In Step 750 of FIG. 7, based on schedule information included in the compiled result and the architecture information of a processor, the assertion generating apparatus 100 determines a point in time, at which a code of the user program, indicated by the assertion directive, is executed, and a functional block that executes the code at the point in time.

In Step 770 of FIG. 7, the assertion generating apparatus 100 generates an assertion stating an operation that the functional block of the processor needs to perform at a point in time when the code of the user program is executed.

Figure 8:
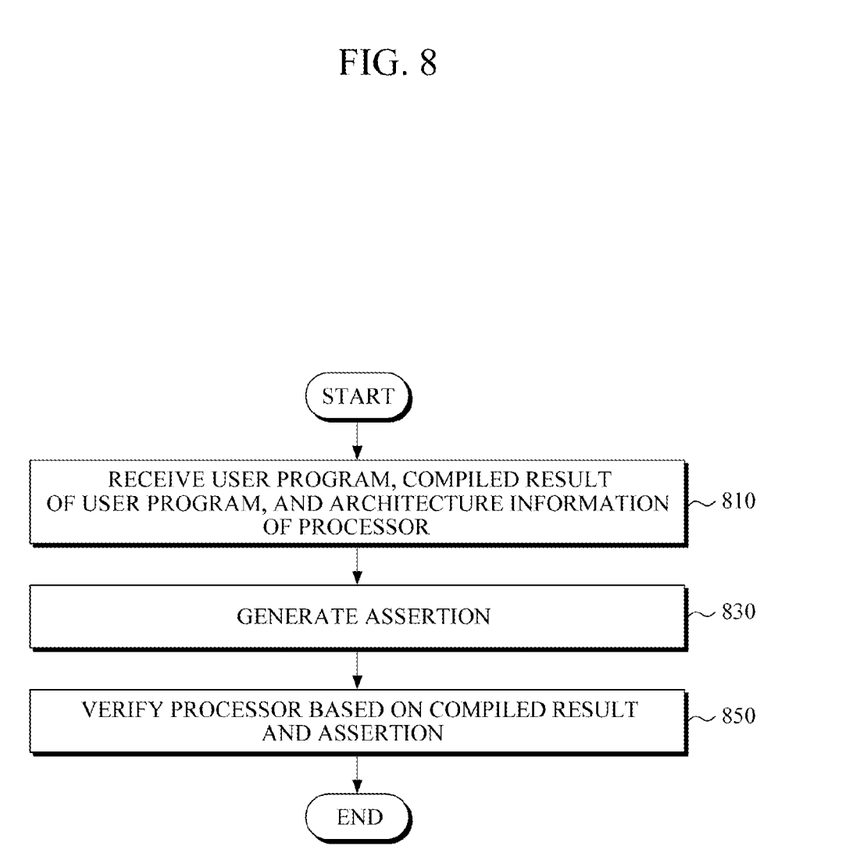
FIG. 8 is a flow chart illustrating a method for verifying a processor according to an exemplary embodiment.

FIG. 8 is a flow chart illustrating a method for verifying a processor according to an exemplary embodiment.

Referring to FIG. 8, in Step 810, the processor verifying apparatus 230 receives a user program including one or more assertion directives, a compiled result of the user program, and architecture information of a processor.

Referring to FIG. 8, in Step 830, based on the compiled result of the user program and the architecture information of a processor, the processor verifying apparatus 230 generates an assertion stating an operation that the processor needs to perform in accordance with a code of the user program, which is indicated by the assertion directive. The processor verifying apparatus 230 may generate the assertion using the same method as described in FIG. 7.

In addition, the processor verifying apparatus 230 may generate the assertion using HDL. If the user program includes a plurality of assertion directives, the processor verifying apparatus 230 generates an assertion corresponding to each assertion directive.

Referring to FIG. 8, in Step 850, the processor verifying apparatus 230 simulates the compiled result of the user program in a processor model designed at RTL so as to verify whether an operation stated in the assertion is performed.

Further, the processor verifying apparatus 230 may insert the assertion in a processor model based on a processor design hierarchy information. Then, by simulating the compiled result of the user program in the processor model into which the assertion is inserted, the processor verifying apparatus 230 checks whether the operation stated in the assertion is performed. In this manner, the processor verifying apparatus 230 verifies an operation of a processor.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, etc. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for generating an assertion based on a user program code in an assertion generating apparatus, the method comprising:

receiving, by the assertion generating apparatus, a user program including at least one assertion directive and a plurality of codes, a compiled result of the user program, and architecture information of a processor, wherein the compiled result of the user program indicates binary codes converted by a compiler from the user program, and the architecture information of the processor indicates information about functional blocks of the processor;

generating, by the assertions generating apparatus, based on the compiled result of the user program and the architecture information of the processor, an assertion which states an operation that the processor needs to perform in accordance with a code of the plurality of codes included in the user program indicated by each of the at least one assertion directive included in the user program, wherein the at least one assertion directive is inserted into a code requiring verification of the operation of the processor from among the plurality of codes included in the user program and indicates the generation of the assertion to verify the operation of the processor; and wherein the generating the assertion comprises:
  determining the code requiring verification of the operation of the processor from among the plurality of codes included in the user program based on an interpretation of the at least one assertion directive; and
  determining a point in time based on schedule information contained in the compiled result and the architecture information of the processor, at which the determined code of the user program, indicated by each of the at least one assertion directive, is executed, and a functional block which executes the code at the point in time.

2. The method of claim 1, wherein the generating the assertion comprises generating the assertion which states the operation that the functional block needs to perform at the point in time.

3. The method of claim 1, wherein the generating the assertion comprises generating the assertion using Hardware Description Language (HDL).

4. The method of claim 1, wherein the generating the assertion comprises generating the assertion corresponding to each of the at least one assertion directive.

5. An assertion generating apparatus comprising:
a hardware processor comprising:
  a receiver configured to receive a user program including at least one assertion directive and a plurality of code, a compiled result of the user program, and architecture information of a processor, wherein the compiled result of the user program indicates binary codes converted by a compiler from the user program, and the architecture information of the processor indicates information about functional blocks of the processor;
  an assertion generator configured to generate, based on the compiled result of the user program and the architecture information of the processor, an assertion which states an operation that the processor needs to perform in accordance with a code of the plurality of codes included in the user program indicated by each of the at least one assertion directive included in the user program,
wherein the at least one assertion directive is inserted into a code requiring verification of the operation of the processor from among the plurality of codes included in the user program and indicates the generation of the assertion to verify the operation of the processor; and
wherein the assertion generator determines the code requiring verification of the operation of the processor from among the plurality of codes included in the user program based on an interpretation of the at least one assertion directive; and
  determines a point in time based on schedule information contained in the compiled result and the architecture information of the processor, at which the determined code of the user program, indicated by each of the at least one assertion directive, is executed, and a functional block which executes the code at the point in time.

6. The assertion generating apparatus of claim 5, wherein the assertion generator generates the assertion which states the operation that the functional block needs to perform at the point in time.

7. The assertion generating apparatus of claim 5 wherein the assertion generator generates the assertion using Hardware Description Language (HDL).

8. The assertion generating apparatus of claim 5, wherein the assertion generator generates the assertion corresponding to each of the at least one assertion directive.

9. A method for verifying a processor, the method comprising:
receiving, at a hardware processor, a user program comprising at least one assertion directive, a compiled result of the user program, and architecture information of a processor;
generating, at the hardware processor, based on the compiled result and the architecture information of the processor, an assertion which states an operation that the processor needs to perform in accordance with a code of the user program indicated by each of the at least one assertion directive;
simulating, at the hardware processor the compiled result in a processor model at a Register Transmission Level (RTL) so as to verify whether the operation stated in the assertion is performed in the processor model,
wherein each of the at least one assertion directive is inserted into the code requiring verification of the operation of the processor from among a plurality of codes contained in the user program and indicates the generation of the assertion to verify the operation of the processor; and
wherein the generating the assertion comprises:
determining the code requiring verification of the operation of the processor from among a plurality of codes contained in the user program based on an interpretation of the at least one assertion directive, and
determining a point in time based on the schedule information contained in the compiled result and the architecture information of the processor, at which the determined code of the user program, indicated by each of the at least one assertion directive, is executed, and a functional block which executes the code at the point in time.

10. The method of claim 9, wherein the generating the assertion comprises generating the assertion which states the operation that the functional block needs to perform at the point in time.

11. The method of claim 9, wherein the generating the assertion comprises generating the assertion using Hardware Description Language (HDL).

12. The method of claim 9, wherein the generating the assertion comprises generating the assertion corresponding to each of the at least one assertion directive.

13. The method of claim 9, wherein the simulating the compiled result comprises inserting the assertion into the processor model and simulating the compiled result in the processor model in which the assertion is inserted.

14. A processor verifying apparatus comprising: a hardware processor comprising:
- a receiver configured to receive a user program comprising at least one assertion directive, a compiled result of the user program, and architecture information of a processor;
- an assertion generator configured to generate, based on the compiled result of the user program and the architecture information of the processor, an assertion which states an operation that a processor needs to perform in accordance with a code of the user program indicated by each of the at least one assertion directive;
- a verifier configured to simulate the compiled result in a processor model at a Register Transmission Level (RTL) so as to verify whether the operation stated in the assertion is performed in the processor model,
- wherein each of the at least one assertion directive is inserted into the code requiring verification of the operation of the processor from among a plurality of codes contained in the user program and indicates the generation of the assertion to verify the operation of the processor; and
- wherein the assertion generator interprets the at least one assertion directive so as to determine the code requiring verification of the operation of the processor from a plurality of codes contained in the user program, and determines a point in time based on schedule information contained in the compiled result and the architecture information of the processor, at which the determined code of the user program, indicated by each of the at least one assertion directive, is executed, and a functional block which executes the code at the point in time.

15. The processor verifying apparatus of claim 14, wherein the assertion generator generates the assertion which states the operation that the functional block needs to perform at the point in time.

16. The processor verifying apparatus of claim 14, wherein the assertion generator generates the assertion using Hardware Description Language (HDL).

17. The processor verifying apparatus of claim 14, wherein the assertion generator generates the assertion corresponding to each of the at least one assertion directive.

18. The processor verifying apparatus of claim 14, the verifier inserts the assertion into the processor model and then simulates the compiled result in the processor model into which the assertion is inserted.

19. A method for generating an assertion based on a user program code in an assertion generating apparatus, the method comprising:
- receiving, by the assertion generating apparatus, a user program including at least one assertion directive and a plurality of codes, a compiled result of the user program, and an architecture information of a processor, wherein the compiled result of the user program indicates binary codes converted by a compiler from the user program, and the architecture information of the processor indicates information about functional blocks of the processor;
- interpreting, by the assertion generating apparatus, an assertion directive so as to determine a code from the plurality of codes in the user program;
- determining, by the assertion generating apparatus, a point in time in which the code of the user program is executed;
- determining, by the assertion generating apparatus, a functional block which executes the code of the user program at the point in time;
- generating, by the assertion generating apparatus, an assertion at the point in time in which the code of the user program is executed,
- wherein the assertion directive is inserted into the code operation of the processor from among the plurality of codes included in the user program and indicates the generation of the assertion to verify the operation of the processor;
- wherein the code requires verification of an operation of the processor;
- wherein the point in time and the functional block are determined based on schedule information included in the compiled result of the user program and the architecture information of the processor; and
- wherein the generated assertion states an operation that the functional block of the processor needs to perform at the point in time when the code of the user program is executed.

* * * * *